(12) United States Patent
Fey et al.

(10) Patent No.: US 7,135,998 B2
(45) Date of Patent: Nov. 14, 2006

(54) ELECTRONIC CIRCUIT ARRANGEMENT FOR ERROR-FREE ANALOG/DIGITAL CONVERSION OF SIGNALS

(75) Inventors: Wolfgang Fey, Niedernhausen (DE);
Mario Engelmann, Steinbach/Ts (DE);
Peter Oehler, Frankfurt am Main (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 0 days.

(21) Appl. No.: 10/513,817

(22) PCT Filed: May 8, 2003

(86) PCT No.: PCT/EP03/04805
§ 371 (c)(1),
(2), (4) Date: Nov. 8, 2004

(87) PCT Pub. No.: WO03/096540
PCT Pub. Date: Nov. 20, 2003

(65) Prior Publication Data
US 2005/0190088 A1 Sep. 1, 2005

(51) Int. Cl.
*H03M 1/06* (2006.01)
(52) U.S. Cl. .................... 341/118; 341/155
(58) Field of Classification Search ............ 341/118, 341/120, 155, 141
See application file for complete search history.

(56) References Cited

U.S. PATENT DOCUMENTS

| 5,185,607 | A | 2/1993 | Lyon et al. | 341/118 |
|---|---|---|---|---|
| 5,594,439 | A | 1/1997 | Swanson | 341/118 |
| 5,659,312 | A | 8/1997 | Sunter et al. | 341/120 |
| 6,396,398 | B1 * | 5/2002 | Donat et al. | 340/508 |
| 6,980,141 | B1 * | 12/2005 | Trocque | 341/120 |

FOREIGN PATENT DOCUMENTS

| DE | 196 40 937 A1 | 4/1998 |
|---|---|---|
| DE | 197 05 406 A1 | 8/1998 |
| DE | 199 12 766 A1 | 6/2000 |
| EP | 0 714 170 A2 | 5/1996 |
| FR | 2 784 193 A1 | 4/2000 |
| WO | WO 00/33465 | 6/2000 |

OTHER PUBLICATIONS

"Properties of the Input Pattern Fault Model" Computer Design: VLSI in Computers and Processors, 1997, ICCD '97, Proceedings., 1997 IEEE International Conference on Austin, TX, USA Oct. 12-15, 1997, Los Alamitos, CA, USA, IEEE Comput. Soc, US Oct. 12, 1997, pp. 372-380, XP010251762 ISBN: 0-8186-8206-X, picture 4A.

PCT International Search Report of Application No. PCT/EP03/04805 dated Jul. 15, 2003.

* cited by examiner

*Primary Examiner*—Peguy JeanPierre
(74) *Attorney, Agent, or Firm*—RatnerPrestia

(57) ABSTRACT

The present invention relates to a circuit arrangement for the error-free analog-to-digital conversion of N analog input signals $N_i$ in a plurality of digital output signals corresponding to the number N using exactly one analog-to-digital converter, wherein N>=1, wherein further N' other redundancy inputs $N'_i$ are provided, and being fed to the said analog-to-digital converter, wherein the N and the N' inputs are supplied to at least one analog multiplexer, and wherein the circuit arrangement has an error monitoring functionality, and each input signal $N_i$ is counter to the corresponding redundancy signal $N'_i$. The invention also relates to the use of the circuit arrangement in electronic motor vehicle control units with an anti-lock function.

14 Claims, 3 Drawing Sheets

ELECTRONIC CIRCUIT ARRANGEMENT FOR ERROR-FREE ANALOG/DIGITAL CONVERSION OF SIGNALS

This application is a 371 of PCT/EP03/04805 filed on May 8, 2003.

TECHNICAL FIELD

The present invention relates to an electronic circuit arrangement for the error-free analog-to-digital conversion of N analog input signals $N_i$ in a plurality of digital output signals corresponding to the number N using exactly one analog-to-digital converter, wherein N>=1, wherein further N' other redundancy inputs $N'_1$ are provided, and being fed to the said analog-to-digital converter, wherein the N and the N' inputs are supplied to at least one analog multiplexer, and wherein the circuit arrangement has an error monitoring functionality. Further on the invention relates to the use of the elctronic circuit arrangement in electronic motor vehicle control units.

BACKGROUND OF THE INVENTION

It is known in the art to design circuits parts that are especially important for the function redundantly or partly redundantly in order to improve the general reliability in operation of circuit arrangements for control units. In the simplest case, the entire circuit is designed fully redundantly, hence is duplicated, and subjected to a more or less distinct spatial/physical separation so that errors will concern, if at all, only one of the duplicated circuit parts. It is a disadvantage in this procedure that frequently the expenditure in cost, the space required, and the current consumption is doubled as well. To process safety-critical signals, it is customary to use two analog-to-digital converters for redundancy reasons. Herein below, the entire analog/digital interface will be referred to as an analog-to-digital converter, that means, including analog multiplexers at the input as well as result registers and (digital) multiplexers at the output of the analog-to-digital converter.

BRIEF SUMMARY OF THE INVENTION

An object of the invention is to provide a low-cost circuit arrangement for the analog-to-digital conversion, which reliably detects occurring errors by using only one analog-to-digital converter in conjunction with an error-monitoring unit.

This object is achieved by the described electronic circuit arrangement.

DETAILED DESCRIPTION OF THE PREFERRED EMBODIMENTS

Figure 1:
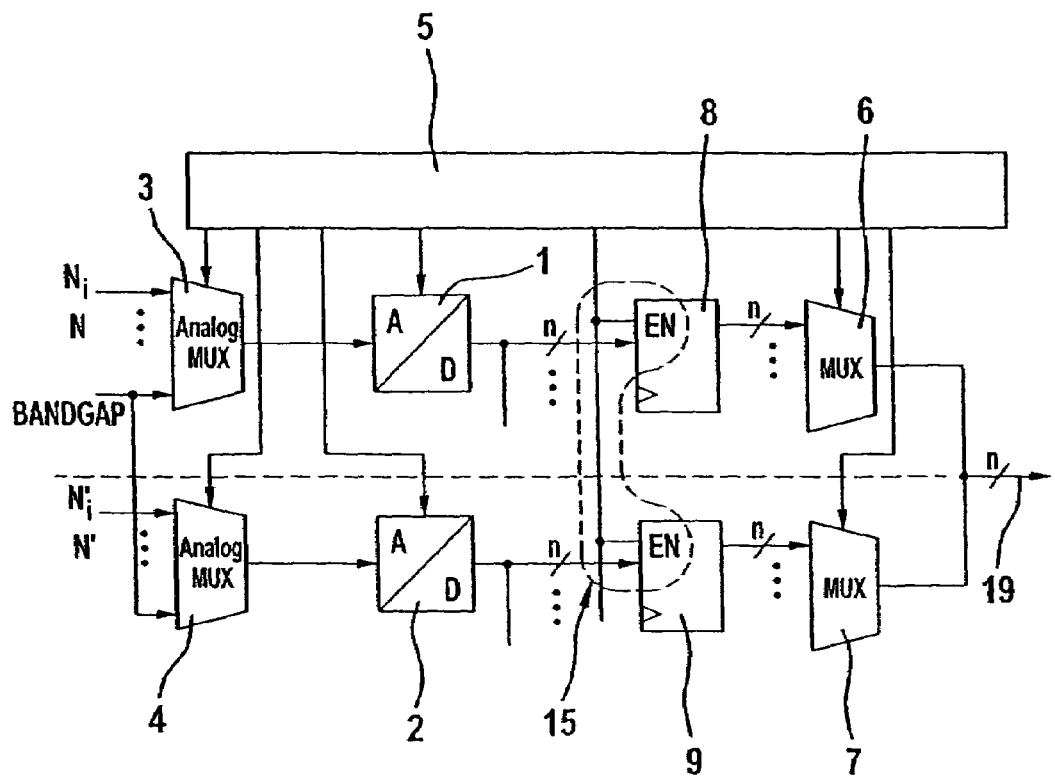
FIG. 1 is a per se known arrangement with two analog-to-digital converters.

FIG. 1 shows a block diagram of a per se known arrangement with two analog-to-digital converters 1, 2. Signals $N_i$, . . . are sent through an analog multiplexer 3 to an analog-to-digital converter 1 for processing. The respectively redundant signals $N'_i$, . . . are sent to another analog-to-digital converter 2 by way of an analog multiplexer 4. The dotted line is meant to indicate that the two analog-to-digital converters 1, 2 must be spatially separated (layout) in order that they function independently of each other. The output signals of the analog-to-digital converters 1, 2 are transmitted to a demultiplexer 15 and stored subsequently in result registers 8, 9. The result registers 8, 9 are connected to digital multiplexers 6, 7 relaying the output signals through a data output 19 to an evaluation device (not shown). The analog multiplexers 3, 4, the analog-to-digital converters 1, 2, the demultiplexer 15, the result registers 8, 9, and the digital multiplexers 6, 7 are actuated herein by way of an actuating logic 5. As another input signal a static signal referred to as BADGAP is applied to the analog multiplexers 3, 4, said static signal being produced independently of the reference voltage of the analog-to-digital converter. Errors in the reference voltage can be discovered by way of monitoring such a static signal.

Figure 2:
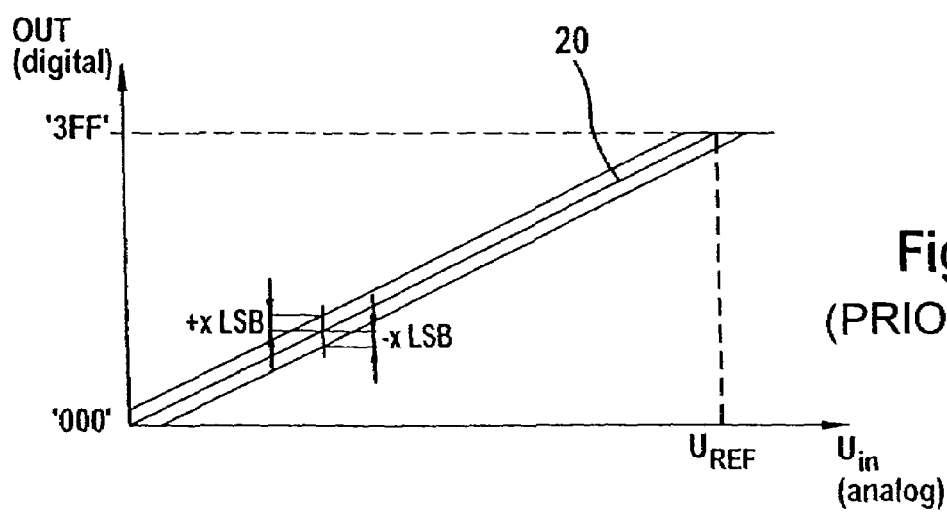
FIG. 2 is a transfer curve of an analog-to-digital converter.

The ideal transfer curve 20 of an analog-to-digital converter is plotted in FIG. 2, the steps not being shown for reasons of clarity. The analog input voltage $U_{in}$ is plotted on the abscissa, and the digital output OUT of the analog-to-digital converter is laid off on the ordinate. An error band depicted by the deviations +x LSB and –x LSB from the ideal transfer curve 20 is disposed around the ideal transfer curve 20.

Figure 3:
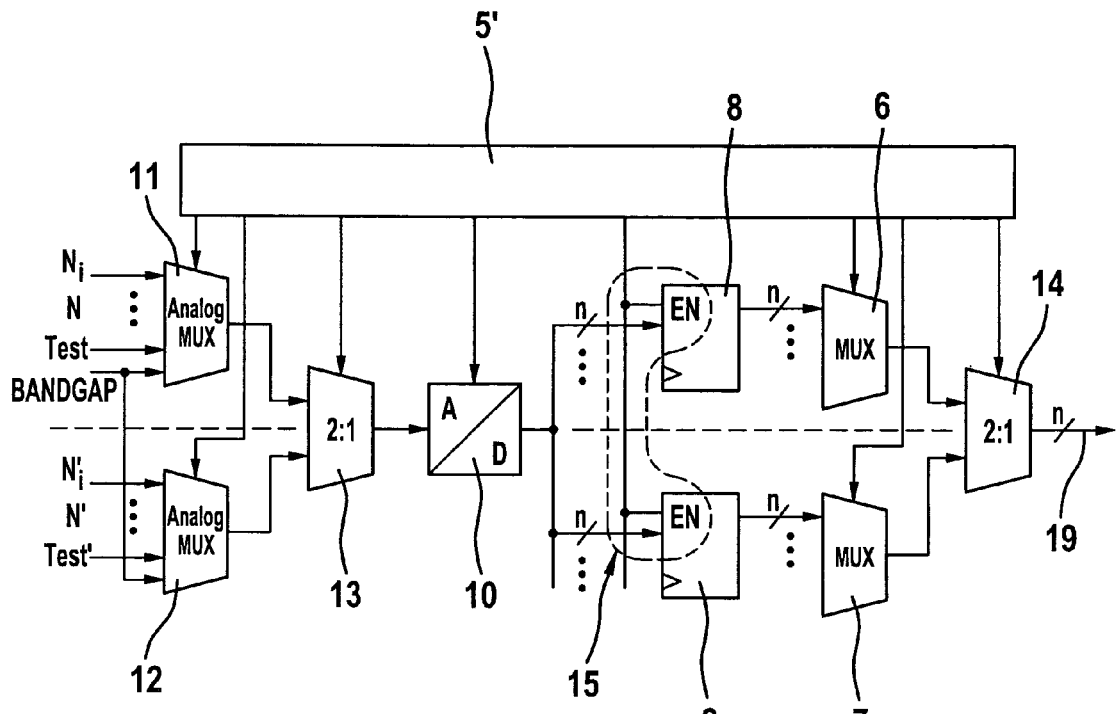
FIG. 3 is a reproduction of the multiplex structures for the operation using one single analog-to-digital converter.

FIG. 3 illustrates a first circuit arrangement of the invention by using only one analog-to-digital converter. Only the differences with respect to FIG. 1 will be described in the following. In turn, signals $N_i$, . . . or signals $N'_i$, . . . and the static signal BANDGAP are applied to the analog multiplexers 11, 12. Further, test signals Test and Test' are connected to the analog multiplexers 11, 12 by way of additional inputs. The outputs of the analog multiplexers 11, 12 are connected to a (2 to 1) analog multiplexer 13 having an output that is connected to an analog-to-digital converter 10. The output of the analog-to-digital converter 10 is connected to demultiplexer 15 with subsequent result registers 8, 9 and digital multiplexers 6, 7. The signal data at the outputs of the digital multiplexers 6, 7 is connected to the data output 19 by way of a (2 to 1) digital multiplexer 14. The analog multiplexers 11, 12, the (2 to 1) analog multiplexer 13, the analog-to-digital converter 10, the demultiplexer 15, the result registers 8, 9, the digital multiplexers 6, 7 and the (2 to 1) digital multiplexer 14 are actuated by way of an actuating logic 5'.

Figure 4:
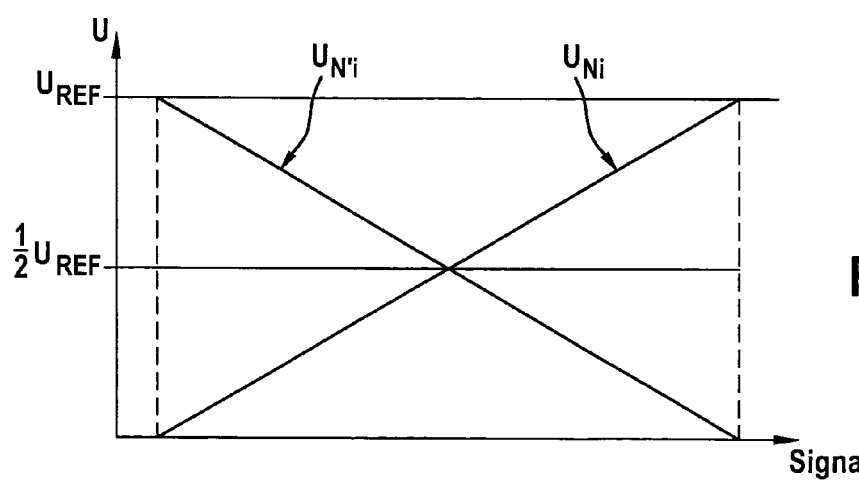
FIG. 4 is an illustration of counter signals.

FIG. 4 illustrates counter signals $U_{Ni}$, $U_{N'i}$ being applied as input signals to the analog-to-digital converter 10 described in FIG. 3. The signal being measured, e.g. relating to pressure or current, is plotted on the abscissa, while the input voltage U of an analog-to-digital converter is plotted on the ordinate.

Figure 5:
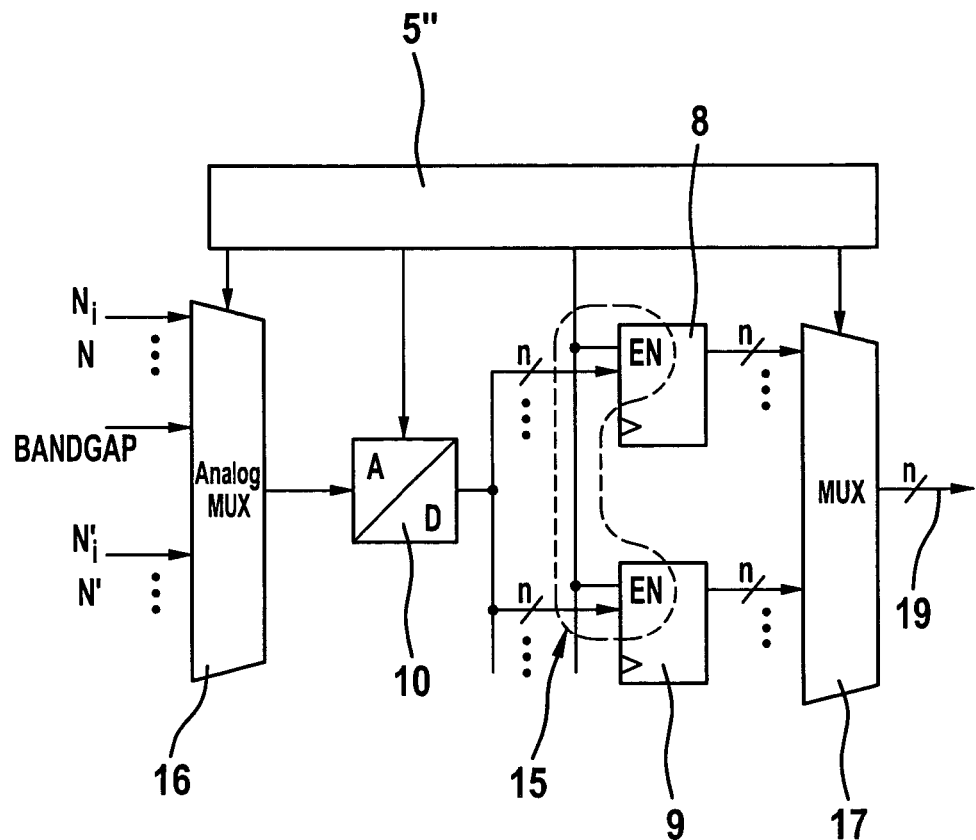
FIG. 5 is an arrangement of redundant counter signals through one single analog-to-digital converter.

FIG. 5 shows another circuit arrangement of the invention. Input signals $N_i$, . . . , $N'_i$, . . . , and the static signal BANDGAP are applied to an analog multiplexer 16. The output of the analog multiplexer 16 is connected to the analog-to-digital converter 10 having an output that is in turn connected through the demultiplexer 15 to the subsequent result registers 8, 9. The outputs of the result registers 8, 9 are connected to a digital multiplexer 17 that transmits output signals through a data output 19 to an evaluating device (not shown). The analog multiplexer 16, the analog-to-digital converter 10, the demultiplexer 15, the result registers 8, 9, and the digital multiplexer 17 are actuated by way of an actuating logic 5".

Figure 6:
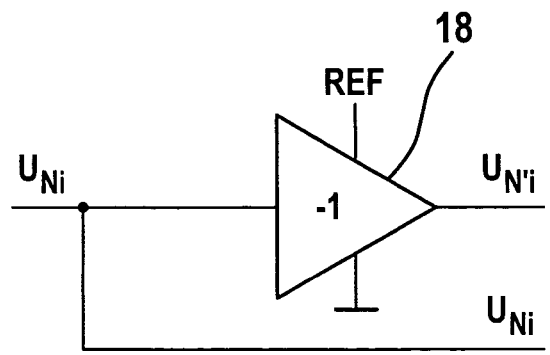
FIG. 6 is a circuit for producing a counter signal.

FIG. 6 illustrates a circuit for producing a counter signal. In this circuit, an input signal $U_{Ni}$ is led directly to an input (not shown) of an analog multiplexer, on the one hand, while the input signal $U_{Ni}$ is sent through an analog inverter 18 to the non-illustrated analog multiplexer as an inverted input signal $U_{N'i}$, on the other hand.

In known circuit arrangements according to FIG. 1, the evaluating device (not shown) receives digital signals through the data output 19, which can be designed e.g. in the form of a serial interface or a data bus, said signals being produced from the analog input signals $N_i$, . . . and $N'_i$ . . . provided by sensors, for example pressure sensors. The evaluating device cannot allocate possible signal errors that falsify the digital signals to an error source, e.g. errors in the analog-to-digital converter 1 because the evaluating device receives as an inlet signal only the superposition of the digital signals with all errors occurring on the signal path. E.g. inaccuracies of the sensors or static errors of the analog-to-digital converters 1, 2 are considered as errors. The static errors of the analog-to-digital converters 1, 2 are combined to a total error which is laid around the ideal transfer curve 20 in the form of an error band, plotted by the deviations +x LSB and −x LSB in FIG. 2. If it is assumed, for example, that only static errors can prevail in the analog-to-digital converters 1, 2 and inaccuracies in the sensors, appropriate measures such as addition will make it possible to define from the static errors and inaccuracies a tolerance range about the ideal transfer curve 20 which is suitable for the detection of a signal error. However, all signals lying within the tolerance range are regarded as error-free values in this procedure. In the result of superposition of errors, an analog-to-digital converter error will only be detected in a sensor without tolerances when it exceeds at least the tolerance of the analog-to-digital converter and that of the sensor. In a sensor fully utilizing its tolerance, an analog-to-digital converter error is detected earlier because the remaining tolerance range is narrower in comparison with a sensor without tolerances.

The circuit arrangement described in FIG. 1 is fully redundant and, as described hereinabove, designed spatially separately due to the layout chosen. Consequently, the input signals and their redundant signals cannot influence each other as a result of an error in the (joint) address logic of the actuating logic 5, neither in the analog multiplexers 3, 4, nor in the analog-to-digital converters 1, 2 or in the result registers 8, 9. Things are different in the digital multiplexers 6, 7 because the signals from the result registers 8, 9 are applied to a data output, e.g. a data bus, a serial interface, etc. This is done e.g. by means of time windows in which a signal is transmitted in a first time window and the signal redundant to said signal is transmitted in a second time window. In the example, the digital multiplexers 6, 7 were spatially separated and connected to 'Tristate' outputs. The address logic must be designed by a suitable coding in such a manner that even in the case of errors in the address logic it is impossible to lay a signal and the signal redundant to this signal on top of each other in the same time window.

Further errors must be examined apart from the errors described above. Assuming that double errors do not occur and also the actuating signals (e.g. clock) of the two analog-to-digital converters 1, 2 are independent of each other, errors in one of the two analog-to-digital converters 1, 2 can be detected due to the redundant design. Stuck-at faults (St-at-0, St-at-1, St-at-x, St-at-open) along the signal paths (the signals $N_i$ and $N'_i$ are jointly led to the data output) are detected on account of the redundancy and the separation.

The following errors can occur in analog and digital multiplexers:
1. Multiplexer has stopped (e.g. due to stuck-at faults of the actuating signals)
2. Multiplexer skips one input signal (another input is chosen instead; e.g. due to stuck-at faults of the actuating signals)
3. Coupling at the analog multiplexer: the value (voltage) of the previous input signal is used.

The independence of the actuating signals must be satisfied apart from the redundancy and the separation for a detection of these errors. The same applies to the actuating signals of the result registers.

A test of an analog-to-digital converter core is described in the following. When examining only one analog-to-digital converter alone, meaning only its core, a redundant design may be omitted when the individual analog-to-digital converter core is modified correspondingly. To this end, a continuous analog-to-digital converter test inserted during the normal operation may be provided, for example, the stimulation by a digital-to-analog converter or a ramp and a corresponding evaluation. This method is per se known from DE-A 19912766 (P 9541).

In a first embodiment the multiplex structures are reproduced for the operation using one single analog-to-digital converter. If, compared to the test of only one analog-to-digital converter, the entire analog/digital interface is examined, the above concept will not be sufficient. Therefore, FIG. 3 shows an arrangement with only one analog-to-digital converter 10, wherein the multiplex structures are so configured that they perform similarly to the spatially separated analog multiplexers 3, 4 (FIG. 1) in a case of error. The basic idea is the division into a range that now as before comprises two spatially separated analog multiplexers 11, 12 and an (2 to 1) analog multiplexer 13 by which the separate outputs of the analog multiplexers 11, 12 are bunched to one joint signal. An active monitoring ensures that the (2 to 1) analog multiplexer 13 and one (2 to 1) digital multiplexer 14 function properly. To this end, a signal Test is applied as a test through the first analog multiplexer 3, while a signal Test' is applied by way of the second analog multiplexer 4. Both signals must be clearly distinguishable from each other, that means Test' is not limited to the inverting of Test. Besides, no other signal is allowed to occur which cannot be distinguished durably from Test and Test'. In case of emergency, the two test signals are not allowed to consist of one static value each (e.g. 2.5 volt and 1.25 volt), but corresponding series of values must be produced subsequently for testing purposes. As described above, the analog-to-digital converter 10 (core) must be extra tested now as before.

FIG. 5 depicts the circuit arrangement of a second embodiment. In this arrangement, the complete second analog-to-digital converter is economized and the analog-to-digital converter test is avoided by using the redundant counter signals e.g. illustrated in FIG. 4. A counter signal according to the invention implies that the main signal $N_i$ differs from the redundancy signal $N_i'$, that means these signals do not correspond with each other as is usual otherwise when redundant signals are processed. An ability to distinguish may either be brought about by an offset level and/or by a characteristic curve that is characteristic of each channel and known to the circuit. In the simplest, preferred case, the main signal and the redundancy signal are linear functions with an opposed sign of the gradient.

The signals being converted in the analog-to-digital converter 10, which may e.g. be pressure sensor signals, yaw rate sensor signals, current values of PWM valves (PWM: pulse width modulation), etc., are sent to the input of the analog-to-digital converter 10 in an opposite direction. This means in particular, a signal with a low voltage level corresponds with a redundant signal with a high voltage level (with an identical value of the signal being measured, e.g. pressure or current), and vice-versa. FIG. 4 shows the voltages (herein at the input of the analog-to-digital converter 10) of the two signals $N_i$ and $N_i'$ being redundant relative each other in dependence on the signal being measured.

It is achieved by the counter signals that a short circuit between redundant signals is detected at optional locations of the signal paths (or a corresponding logic error regarding the multiplexers). This applies to the total chain of signals, e.g. until into a processor core. Only when the corresponding voltage levels are exactly in the medium range is a short circuit not detected. However, the values measured then are still correct. The short circuit is detected though with the switch off at the latest (e.g. PWM valves).

The redundant measurement allows testing also the analog-to-digital converter 10 employed in the respectively used voltage range in which the input quantities are disposed. The signals redundant to each other are measured by way of the same analog-to-digital converter 10, however, at different locations of the transfer curve. Thus, the one signal can be remote by +x LSB from the ideal transfer curve 20 (FIG. 2), and the redundant signal by −x LSB, or vice-versa. Regarding the error monitoring exactly the same considerations apply as to the design using two analog-to-digital converters described hereinabove. As a result, the quality of monitoring the analog-to-digital converter(s) of both methods is the same.

If the sensor does not directly provide redundant counter signals, an analog inverter 18 can be provided alternatively at an input of the analog multiplexer 16 in order to produce a counter signal. A circuit suitable for this purpose is illustrated in FIG. 6. Error monitoring can be performed thereby for the analog-to-digital converter 10 including multiplexers.

Another possibility of making a distinction between the main signal and the redundancy signal is described in the following. Problems in the error detection can arise among others when a signal is fixed to a basic level, e.g. the main signal at said level is at 0 volt, the redundant signal is at $U_{REF}$. When the main signal is now fixed to 0 volt due to an error, or a logic error causes a static signal of approximately 0 volt to be erroneously laid to this main signal (by means of an analog or digital multiplexer), the redundant signal will be fixed to $U_{REF}$ after any time desired without leaving the basic levels. This error pattern cannot be detected under certain circumstances.

With so-called active signals where software predefines an action (switch valves, control pressure, etc.) and waits for a reaction, it is detected that redundant signals are fixed to their basic levels. This statement does not apply with so-called passive signals where an outside influence is merely monitored. A yaw rate signal at the basic level e.g. typically lies at half the level of $U_{REF}$ (and, hence, also the redundant yaw rate signal). In the solution with only one analog-to-digital converter a simple logic error will possibly be sufficient to apply the bandgap voltage (which e.g. lies also at $U_{REF}/2$ level) erroneously to both yaw rate signals. When a change of the yaw rate signal occurs, the evaluation (software) would e.g. conclude a steering angle sensor error since both yaw rate signals supply plausible values.

It is, therefore, expedient to configure static signals as being programmable or reversible, e.g. by way of a voltage divider. This imparts a dynamic configuration to the signals. As a solution to the above-described problems, it is e.g. advisable to make the bandgap voltage programmable, namely shiftable between the $U_{REF}/2$ and $U_{REF}/4$ level. Switch-over in regular intervals to the $U_{REF}/4$ level is then needed, and the two yaw rate signals must be checked which must then both supply a voltage level of $U_{REF}/2$ at the basic level. It is important in this solution that the switch-over of the bandgap voltage must take place spatially separated from the analog multiplexer. Besides, no other voltage of roughly the $U_{REF}/2$ level should be in the vicinity of the analog multiplexer.

These problems with static signals, that e.g. a bandgap voltage erroneously superposes on both yaw rate signals, also appears in the solution with two analog-to-digital converters. However, a double error is necessary in this case, the first error being a sleeping error. Consequently, there is little likelihood of an error pattern of this type.

The invention claimed is:

1. Electronic circuit arrangement for the error-free analog-to-digital conversion of N analog input signals $N_i$ in a plurality of digital output signals corresponding to the number N using exactly one analog-to-digital converter, wherein N>=1, wherein further N' other counter inputs $N'_i$ are provided, and being fed to the said analog-to-digital converter, wherein the N and the N' inputs are supplied to at least one analog multiplexer, and wherein the circuit arrangement has an error monitoring functionality, wherein each input signal $N_i$ is counter to the corresponding counter signal $N'_i$ and the error monitoring functionality evaluates the counter signal $N'_i$ in conjunction with the input signal $N_i$.

2. Electronic circuit arrangement as claimed in claim 1, wherein at least one input signal is led through an analog inverter to produce a distinguishable signal.

3. Electronic circuit arrangement as claimed in claim 2, wherein output from the analog-to-digital converter is sent to a demultiplexer.

4. Electronic circuit arrangement as claimed in claim 3, wherein output from the demultiplexer is led to inputs of at least one result register for storing N+N' digital words.

5. Electronic circuit arrangement as claimed in claim 4, wherein the converted N+N' signals are sent to a multiplexer, which generates a data signal.

6. Electronic circuit arrangement as claimed in claim 1, wherein the analog input signals concern measured currents of load driving stages.

7. Electronic circuit arrangement as claimed in claim 1, wherein a testing means is provided that allows checking proper function of the analog-to-digital converter with a ramp signal generator and a test circuit arrangement to activate a test cycle.

8. Electronic circuit arrangement as claimed in claim 1, wherein a bandgap voltage is further provided and a means for varying the bandgap voltage is provided.

9. Electronic circuit arrangement as claimed in claim 8, wherein the bandgap voltage is applied to the input of the analog-to-digital converter for error detection.

10. Electronic circuit arrangement as claimed in claim 1, wherein a mean for the variation of any other externally predefinable voltage for detecting errors is provided.

11. Electronic circuit arrangement as claimed in claim 10, wherein any other externally predefinable voltage is applied to the input of the analog-to-digital converter for error detection.

12. Electronic circuit arrangement as claimed in claim 1, wherein a first and a second analog input is provided and the first input with N signals jointly with a first test signal is sent to a first (N to 1) analog multiplexer, and the N' signals of the second input jointly with a second test signal which is distinguishable from the first test signal are sent to a second (N' to 1) analog mutiplexer.

13. Electronic circuit arrangement as claimed in claim 12, wherein the outputs of the analog multiplexer are sent to a (2 to 1) analog multiplexer, to provide a number of signal channels to the analog-to-digital converter, and the output of the analog-to-digital converter is split up into digital signal channels equal to twice the number of the signal channels by means of a demultiplexer, wherein subsequently the digital signal channels are connected to a data output by way of a (2 to 1) digital multiplexer.

14. Use of the electronic circuit arrangement as claimed in claim 1 in electronic motor vehicle control units with an anti-lock function including an electronic brake system.

* * * * *